United States Patent [19]
Imhoff

[11] Patent Number: 5,981,975
[45] Date of Patent: Nov. 9, 1999

[54] ON-CHIP ALIGNMENT FIDUCIALS FOR SURFACE EMITTING DEVICES

[75] Inventor: Eugene A. Imhoff, Princeton, N.J.

[73] Assignee: The Whitaker Corporation, Wilmington, Del.

[21] Appl. No.: 09/031,586

[22] Filed: Feb. 27, 1998

[51] Int. Cl.⁶ ................................. H01L 33/00
[52] U.S. Cl. .................. 257/81; 257/94; 257/95; 257/96; 257/99; 257/622; 257/623; 257/797
[58] Field of Search ................. 257/797, 99, 95, 257/81, 623, 94, 96, 622

[56] References Cited

U.S. PATENT DOCUMENTS

| 4,802,727 | 2/1989 | Stanley | 350/96.2 |
|---|---|---|---|
| 4,904,036 | 2/1990 | Blonder | 350/96.11 |
| 4,949,148 | 8/1990 | Bartelink | 357/74 |
| 5,011,247 | 4/1991 | Boudreau et al. | 350/96.2 |
| 5,073,003 | 12/1991 | Clark | 385/33 |
| 5,077,878 | 1/1992 | Armiento et al. | 29/25.02 |
| 5,163,108 | 11/1992 | Armiento et al. | 385/89 |
| 5,179,609 | 1/1993 | Blonder et al. | 385/89 |
| 5,182,782 | 1/1993 | Tabasky et al. | 385/89 |
| 5,412,748 | 5/1995 | Furuyama et al. | 385/92 |
| 5,420,953 | 5/1995 | Boudreau et al. | 385/88 |
| 5,479,029 | 12/1995 | Uchida et al. | 257/81 |
| 5,481,629 | 1/1996 | Tabuchi | 385/14 |
| 5,533,158 | 7/1996 | Han et al. | 385/88 |
| 5,555,333 | 9/1996 | Kato | 385/89 |
| 5,614,734 | 3/1997 | Guido | 257/94 |
| 5,798,536 | 8/1998 | Tsutsui | 257/99 |
| 5,838,029 | 11/1998 | Shakuda | 257/190 |

FOREIGN PATENT DOCUMENTS

| 0 226 296 | 6/1987 | European Pat. Off. | G02B 6/42 |
|---|---|---|---|
| 0 304 118 | 2/1989 | European Pat. Off. | G02B 6/36 |
| 0 532 469 A1 | 3/1993 | European Pat. Off. | G02B 6/30 |
| 43 01 236 C1 | 3/1994 | Germany | G02B 6/42 |
| 55-157277 | 12/1980 | Japan | H01L 21/12 |
| 59-185306 | 10/1984 | Japan | 385/49 |
| 63-239890 | 10/1988 | Japan | 385/88 |
| 2-4204 | 1/1990 | Japan | 385/49 |
| 5-249340 | 9/1993 | Japan | 385/49 |
| 6-118262 | 4/1994 | Japan | 385/88 |

OTHER PUBLICATIONS

"Optoelectronic Integration: Physics, Technology and Applications", O. Wade (Ed.) Kluwer Academic Publishers, 1994, pp. 414–417; and pp. 113–119.

U.S. application No. 08/269,300; Filed Sep. 12, 1994. Entitled "Solder Attachment of Optical Fiber To Semiconductor Waferboard"; Boudreau et al.

U.S. application No. 08/674,770; Filed Jan. 26, 1998. Entitled "Passive Alignment Frame Using Monocrystalline Material"; Boudreau et al.

*Primary Examiner*—William Mintel
*Attorney, Agent, or Firm*—William S. Francos; Gerald K. Kita

[57] ABSTRACT

An optoelectronic apparatus has, a die having a mesa (103) with a surface emitting optical device and a metallized p-type contact (209), a planar pad (201) adjacent the mesa for Z-height registration with an optical bench, a first notch (206) having been provided by a first etch and having thereon a metallized n-type contact (208) that is coplanar with the p-type contact (209), a second notch having a side surface (204) having been provided by a second etch, the second notch to abut the optical bench along an x-axis, the first notch (206) extending to the second notch, and the die having side surfaces (207) to abut the optical bench along a y-axis, and the second notch extending to the side surfaces (207).

11 Claims, 3 Drawing Sheets

Light Emission

ON-CHIP ALIGNMENT FIDUCIALS FOR SURFACE EMITTING DEVICES

FIELD OF THE INVENTION

The present invention relates to alignment fiducials fabricated on the semi-conductor die of surface emitting devices for optoelectronic applications.

A BACKGROUND OF THE INVENTION

A light emitting device often utilizes a double heterostructure in which an active region of III–V semiconductor is sandwiched between two oppositely doped III–IV compounds. By choosing appropriate materials for the outer layers, the band gaps are made to be larger than that of the active layer. This procedure, well known to one of ordinary skill in the art, produces a device that permits light emission due to recombination in the active region, but prevents flow of electrons or holes between the active layer and the higher band gap sandwiching layers due to the differences between the conduction band energies and the valence band energies, respectively. Light emitting devices can be fabricated to emit from the edge of the active layer, or from the surface. Typically, the first layer of material, the substrate, is n-type Indium Phosphide (InP) with an n-type buffer layer, which, again, is Indium Phosphide normally. The active layer is often a quaternary material and is p-type. This active layer is, for example, Indium Gallium Arsenide Phosphide (InGaAsP) with a p-type cladding layer for example, again, Indium Phosphide disposed thereon. Such a structure is made to have light emission which is orthogonal to the plane of the layer of the active region, rather than from a direction which is parallel to the plane of the active layer, which is an edge emitting device.

One area of optoelectronics which has seen a great deal of activity in the recent past is passive alignment. Silicon waferboard, which utilizes the crystalline properties of silicon for alignment of optical fibers, as well as passive and active optical devices has gained a great deal of acceptance in the recent past. One technique for aligning an optoelectronic device to an optical fiber and other passive/active elements is the use of alignment pedestals for x, y planar registration and standoffs for height registration. By virtue of the sub-micron accuracy of photolithography, the etching of alignment fiducials has proven to be a viable alignment alternative. By effecting alignment in a passive manner, the labor input to the finished product can be reduced, resulting in increased performance at a reduction in labor input during the alignment process. One example of such a passive alignment scheme can be found in U.S. Pat. No. 5,163,108 to Armiento, et al., the disclosure of which is specifically incorporated by reference herein. The reference to Armiento, et al., makes use of an alignment notch on the chip of the device with alignment pedestals disposed on the silicon waferboard. This structure is for aligning an optical fiber array to an array of light emitting devices.

While the reference to Armiento, et al., is a viable approach to aligning an edge emitting device, there is a need in the industry to make use of surface emitting devices. An alternative approach to the structure disclosed in the reference to Armiento, et al. which does enable the passive alignment of surface emitting devices is as disclosed in U.S. patent application Ser. No. 08/674,770 to Boudreau, et al., the disclosure of which is specifically incorporated herein by reference. While the reference to Boudreau, et al. makes use of a passive alignment member which is fabricated from silicon and is used to effect the alignment of an optoelectronic device which is either surface emitting or detecting, there is a need for alignment of the surface emitting/detecting device through precision notches directly on the device.

Accordingly, what is needed is an alignment technique for aligning a surface emitting/detecting optoelectronic device by way of alignment fiducials directly on the die of the device.

SUMMARY OF THE INVENTION

The present invention is drawn to a surface emitting optoelectronic device having grooves on the die which effect alignment in the x direction for planar registration and planar pad areas on the die which effect alignment in the z direction for height registration to properly align the focal plane of the device to an optical fiber, for example. As will be discussed herein, the invention of the present disclosure has applicability to many different devices, with the common element being the etching properties of the quaternary active layer. To this end, the present invention is drawn to surface emitting devices which use a quaternary material as is described herein. The axial alignment is effected with respect to the mesa of a light emitting diode. This alignment is done in a two step etch process which makes use of the etching properties of various materials which are used in the fabrication of conventional light emitting devices.

In a first etch, the mesa of the surface emitting light emitting diode (SLED) is defined. A groove is etched during this etch step for passive alignment. To this end, during a first photolithographic step, a layer of $SiO_2$ is deposited and patterned, whereby the mesa is etched at a particular point on the die, and grooves are also etched for alignment purposes. Through this first step, the groove is etched relative to the mesa center to within a tolerance on the order of 0.3 microns. This groove is etched about the perimeter of the mesa, and for reasons set forth herein one of the grooves is used to locate an ohmic contact. A second etch step is carried out thereafter to define the depth of the groove, on either side of the mesa, while maintaining the precision of the distance from the edge of the groove to the mesa center. This second etch is for the express purpose of making the groove deeper so that the x alignment pedestals disposed on the silicon waferboard only contact the device along the alignment fiducials established by the first etch. For the first and second etches, smooth planar pads are preserved for registration to the stand-offs disposed on the silicon waferboard. That is, portions of the original wafer surface are protected from etching for the express purpose of providing subsequent Z height registration for the focal plane of the device. These smooth planar pad areas are for the express purpose of providing sufficient area for the standoffs to maintain z-height registration during the complete movement of x and y alignment.

One novel feature of the invention at the present disclosure lies in the use of materials in effecting the alignment grooves of the die. To this end, a layer of quaternary materials (Indium Gallium Arsenide Phosphide—InGaAsP) is used for both the active layer and in the etching process. To this end, this layer is a common material used in light emitting diodes for the active layer between the cladding layers of the LED. However, in the second etch, the etchant is chosen so that it will not etch the quaternary material. Thereby through the proper placement of the quaternary material, relative to the center of the mesa, the proper distance from the center of the mesa to the alignment groove is maintained while the other layers of material readily etch to the proper depth. That is, the quaternary material serves as the etch-stop for the second etch for the depth of the alignment fiducials.

Furthermore, the device of the present disclosure in its preferred embodiment is envisioned to function in an optical transceiver for example as is disclosed in U.S. Patent Application Numbers (TWC Docket No. 17182L as well as TWC Docket No. 17213). Some of the advantages of the use of the structure of the present invention in the transceiver packages of the referenced Patent Applications will be elaborated upon infra.

OBJECTS, FEATURES AND ADVANTAGES

It is an object of the present invention to have on-chip alignment for optoelectronic surface emitting devices.

It is a feature of the present invention to have an alignment groove etched along an outer edge of the chip with the groove being aligned to the center of the mesa at a prescribed distance.

It is an advantage of the present invention that the alignment groove effects x axis registration as well as registration of the focal plane of the light emitting device in the z direction.

DETAILED DESCRIPTION OF THE INVENTION

Figure 1A:
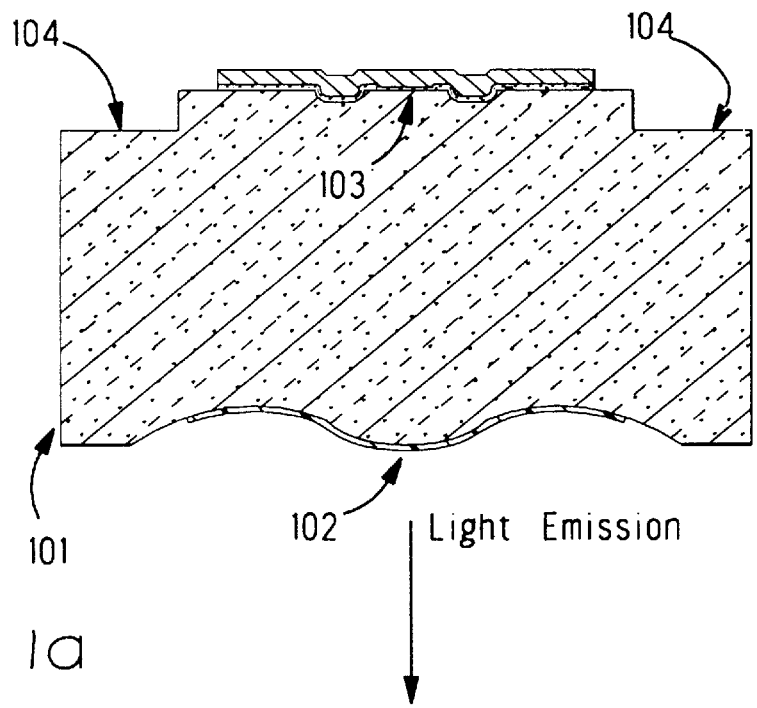
FIG. 1a is cross-sectional view of the preferred embodiment of the invention of the present disclosure, showing the deeper grooves formed in the second etch step for x-direction alignment to side pedestals on silicon waferboard.

FIG. 1 shows a cross sectional view of the preferred embodiment of the present disclosure, a surface emitting light emitting device, such as an SLED 101. While the preferred embodiment is an SLED, it is clear that the passive alignment scheme of the present invention could be applied to other surface emitting devices such as a vertical cavity surface emitting laser (VCSEL). An integral lens 102 is formed by techniques well known in the art, as is disclosed in U.S. Pat. No. 4,797,179, to Watson, et al., the disclosure of which is specifically incorporated herein by reference. The light emitting diode mesa structure is shown at 103, with the notch regions at 104 for passive alignment of the LED 101 to a silicon waferboard or other suitable optical bench well known to one of ordinary skill in the art (not shown).

Figure 2:
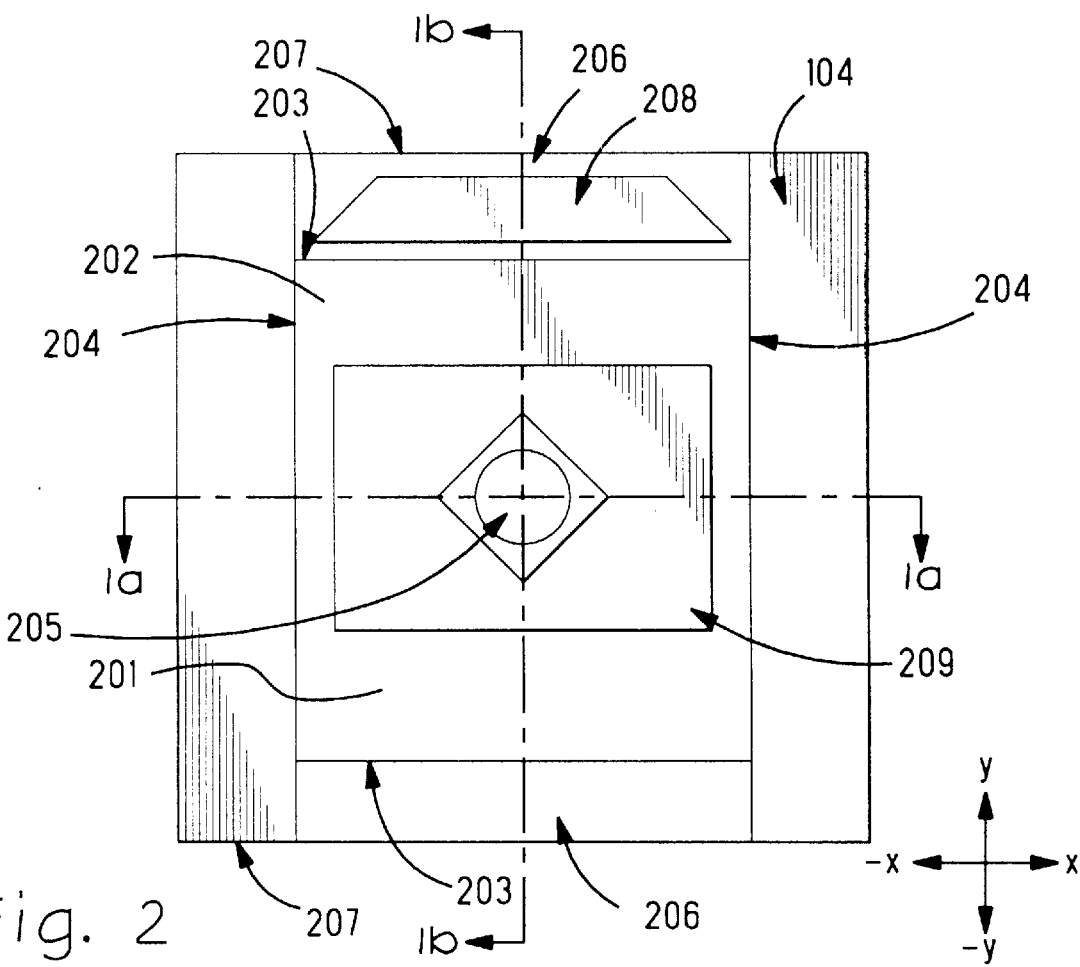
FIG. 2 is a top view of the back side of the preferred embodiment of the present disclosure.

The grooves 104 and planar pads 201, 202 in FIG. 2, are used in passive alignment in the x and z directions through the use of pedestals and standoffs, respectively, again well known to one of ordinary skill in the art. In the preferred embodiment of the present disclosure, the registration of the die is effected as follows. The registration of the device for proper passive alignment is effected in an exemplary manner as follows. The device is set down on the landing pads 201, 202 which are used for z height registration to the fiducial standoffs on the silicon waferboard (not shown). The die is thereafter moved in the -y-direction (using the axis shown in FIG. 2 for reference). Upon abutting the side surface 207 to the y pedestal, or side pedestal, on the silicon waferboard, the die is then moved in the -x-direction. This motion is continued until the x pedestal, or side pedestal abuts the edge or side surface shown at 204. In this manner, the proper location of the die in the x-direction by the use of the side of the edge 204 and the y-direction through the side of the edge 207 effects planar registration of the die. The standoffs which make contact to the landing pads 201 and 202 assure proper z-height registration for proper alignment to the focal point. Further understanding of the use of alignment fiducials to include pedestals and standoffs can be found in U.S. Pat. No. 5,163,108 to Armiento, et al., as referenced above as well as U.S. patent application Ser. No. 08/674,770 to Boudreau, et al., the disclosures of which are incorporated herein by reference.

Figure 3:
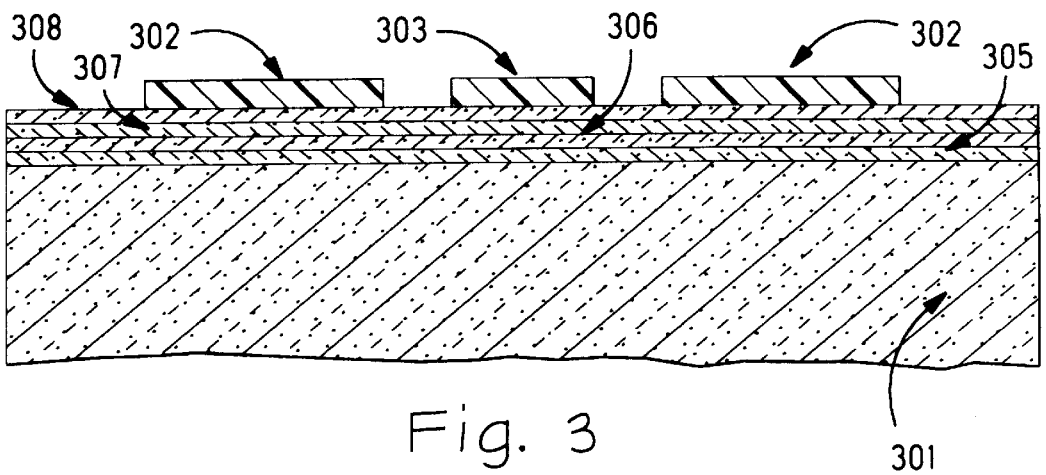
FIGS. 3–5 are cross sectional views of the fabrication steps for fabricating the mesa structure surface emitting LED of the present disclosure.

Turning to FIG. 3, the processing steps for fabricating the preferred embodiment of the present disclosure are discussed. The substrate 301 is preferably n-type Indium Phosphide (InP). A layer of n-type Indium Phosphide is used as the buffer layer 305, 405 in FIG. 4. The quaternary layer 306, 406 serves as the active layer of the LED, and a p-type cladding layer 307, 407 and p-type cap layer 308, 408 are disposed thereon. The p-type cladding layer is also Indium Phosphide while the cap layer is also quaternary material, Indium Gallium Arsenide Phosphide. A layer of silicon dioxide is deposited though standard technique on top of the cap layer, with a layer of photoresist disposed thereon. The photoresist is exposed and the exposed photoresist is removed by standard technique in areas which are to remain unprotected to pattern the silicon dioxide, to effect the features 302, 303 used in the first etching step. Thereafter, the etching is effected using non-selective etchant, typically containing hydrobromic acid, to reveal the mesa structure of FIG. 4. This etching step effects an etch on the order of 4 to 5 microns, as far down as the substrate, however normally only down to the buffer layer. During the first etching step, the mesa shown at 205 in FIG. 2 is defined. Additionally, during this first etch step, which is at a depth on the order of 4–5 microns, the side notch or edge having a flat surface 206 and a side surface 203 is also defined. This notch or edge effected in this first etch is about the perimeter of the die and serves as the basis for the deeper grooves used for alignment to the side pedestals. The notch or edge shown at 206 will have the added metallization that makes n-type contact 20 co-planar with the metallization for the p-type contact 209 of the mesa structure 205. The first etch also reveals notches 104 shown in FIGS. 1 and 2 which has a side surface 204. The second etch effects the final depth of the grooves 104 having side surfaces 204. Again, this etch is deeper than that of the first etch step, as is described herein. Finally, the side surfaces 207 are effected during a cleaving step. Accordingly, the first etch disposes a perimeter about the die at a depth on the order of 4–5 microns, as well as reveals the mesa shown at 205 in FIG. 2 and enables the p and n contacts to be on the same side of the die. After completing the first etching step, a layer of silicon dioxide is deposited as shown at 402. This layer is used to protect the mesa structure, and is patterned by standard photolithographic technique in a manner so that it does not come to the edge of the previous etch. This layer of $SiO_2$ has an edge which does not cover the quaternary layer 406 which is used as an etch-stop layer in the second etching step. The edge of the $SiO_2$ 403 is preferably 3–10 $\mu$m to the edge of the quaternary layer 406. The second etch, which is slightly re-entrant by design, assures that the alignment fiducial edge 404 is the point of contact with the alignment pedestal on the silicon waferboard. That is, as can be seen in FIG. 5, the edge of layer 406 which is originally located in the first etch, is maintained with great precision (to within an accuracy of 0.3 $\mu$m) relative to the mesa center and abuts the side pedestal on the silicon waferboard.

In the first etching step, the distance between the edge 404 and the center of the active region of the mesa structure of the LED is defined. This distance is shown as "d" in FIG. 4 and is on the order of 100 $\mu$m. The distance "d" establishes very precisely, the distance from the center of the active region of the LED to the alignment notch 104 by virtue of photolithographic etching techniques to submicron accuracy. A further etch is required in order to have a notch 104 which is deep enough for proper alignment in the x direction for planar alignment and the z direction for focal point registration. Furthermore, one of the regions of the notch in the first etch step is used for same-side p- and n-type contacts 209, 208 to enable the elimination of wire bonding. To this end, through standard electroplating techniques, the n contact 208 is disposed on the surface 206 of one of the "shallower" notches defined by 203, 206, while the p-contact 209 is disposed as shown most clearly in FIG. 2. These contacts 209, 208 are made co-planar in this process. The layer 402 of silicon dioxide 403 comes nearly to the edge (shown in FIG. 4 at 403) of the quaternary layer 402 and close to the edge 404 of the notches 104. This placement of the silicon dioxide layer 402 protects the mesa and substantially all of the quaternary layer 406 near the edge 409. However, in the subsequent etch step, a suitable etchant, typically containing hydrochloric acid, is chosen that does not etch the exposed quaternary layer 406 but, which does etch Indium Phosphide to replicate the aforementioned fiducial alignment edge 404 to the required depth. The oxide layer 402 is not deposited to the edge of the quaternary layer 406, as over-coating or completely covering the cap layer 408 or even depositing the oxide 403 in the region revealed by the first etch could potentially destroy the alignment of the notch 104 to the center of the mesa 205.

Figure 4:
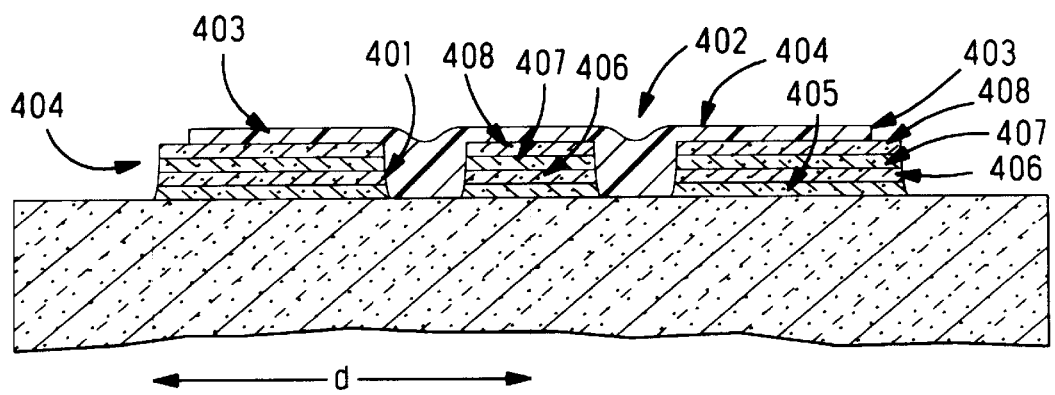
Figure 5:
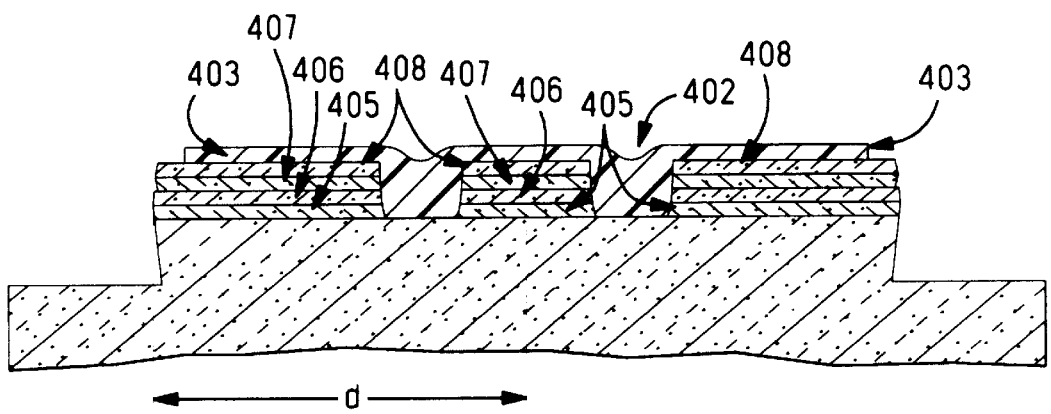

The first etching step shown in final form in FIG. 4 has the proper position or alignment of the notch 104 for pedestal registration to the waferboard, but is not deep enough. Accordingly, a deeper etch is required, on the order of 12–20 microns (shown in FIG. 4). This subsequent etch is carried out with a suitable etchant which will not etch the edge 404 of the quaternary layer 406 which is formed in the first etching step. The edge 404 of this quaternary layer 406 is relatively sharp, and this precision as well as the precision relative to center of the mesa 205 is maintained by taking the oxide layer 402 in the subsequent etching step to nearly the edge 404 of the quaternary layer 406, but not to the edge 404. Re-entrant etching using the appropriate quaternary layer 406 to resist etching, thereby maintains the precision but at the same time enables the proper depth to be etched as described above. This is an important advantage of the preferred embodiment of the present invention. The sides of the deep notches 104 the chip are used for x alignment only in this device.

This gives an accuracy of well under 1 $\mu$m, typically 0.3 $\mu$m given this invention. In the y direction, the alignment is determined by the accuracy of the scribing operation, on the order of 2 $\mu$m. The wet chemical etch that is used to replicate the initial etched edge deeper into the wafer is sensitive to the crystal structure and is not readily adaptable to the y direction alignment. Therefore, in the y direction, in the preferred embodiment of the present disclosure, a scribing operation is effected in order to provide the side surfaces shown in FIG. 2 at 207. While this is the preferred embodiment of the present disclosure, it is possible that an etching step or a combination of an etching and scribing step could be used in order to effect this side surface for y direction registration to a side pedestal on the silicon waferboard.

In the Z direction, the stand-offs rest on the original surface in the smooth planar pads 201, 202. These planar areas are protected by $SiO_2$ during all etching steps. These pads are designed to be large enough in the x and y directions (reference coordinate axes in FIG. 2) to accommodate the full range of movement of the z-axis standoffs (disposed on the waferboard, not shown) on the surface of the LED during the alignment process. Finally, while the preferred etch-stop is a quaternary material 206 with a wet etchant referenced referenced above, it is clear that the invention can be modified in both etch-stop material and etch in order to effect the relative alignment of the present invention. For example, instead of InGaAsP, and a solution containing hydrochloric acid as the etchant, the etch stop could be $SiO_2$ and methane-hydrogen reactive ion etching (RIE) could be used to effect the etching.

Figure 1B:
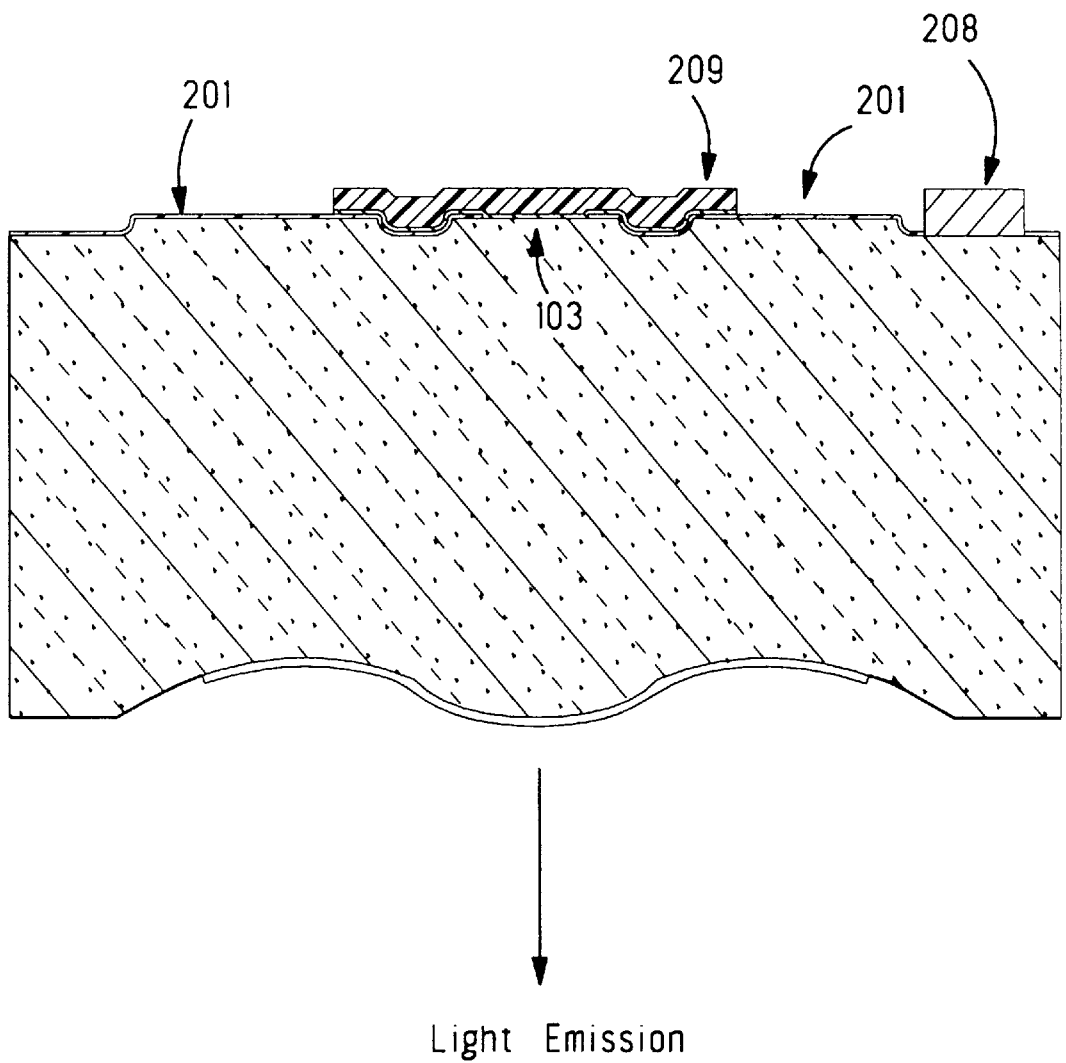
FIG. 1b is a cross-sectional view of the preferred embodiment of the present disclosure showing the grooves etched in the first etch step with the one of the ohmic contacts in the groove as well as the landing pads on either side of the mesa.

Thereafter, the p and n contacts 209, 208 in layers are effected through standard metallization and lift-off techniques with a thin layer of Ti/Pt/Au disposed in the p contact opening. The metal thickness is adjusted during electroplating to bring both n and p up to the same height. This is shown in FIG. 1b. Finally, the backside processing is carried out in order to form the integral lens 102 if desired. Furthermore, in lieu of the integral lens, a hologram could be effected by known techniques or in the alternative other lens 102 elements can be use which are not integral to the chip. The device contacts are on the same side of the device in order to forego the use of wirebonds. In applications where the emitter and detector are bonded to a silicon waferboard or other suitable substrate in close proximity, the wirebonds can be and preferably must be eliminated. In this case, the contacts 209, 208 are on the chip and one notch defined by 206, 208 of the die can have the contact 208 therein. As stated, the device 101 fabricated by the disclosure herein can be flip-chip bonded to a silicon waferboard substrate requiring no wirebonds. This enables the detector and emitter to be bonded to the silicon waferboard in relatively close proximity (on the order of 750 microns). However, in order to avoid optical cross-talk, lens elements 102 will be required in order to properly couple the light to the respective optical fibers in a manner which minimizes the detrimental effects of cross-talk. The invention of the present disclosure can be used in an industry standard fiber-optic transceiver package known as the mini-MT. Further details of both the coupling and packaging can be found in U.S. patent application Ser. No. 09/031,592, filed Feb. 27, 1998, and U.S. patent application Ser. No. 09/031,585, filed Feb. 27, 1998, the disclosures of which are specifically incorporated herein by reference.

The invention having been described in detail, it is clear that modifications and variations of the present disclosure are readily apparent to one of ordinary skill in the art having had the benefit of the present disclosure. To the extent that a variation in technique for fabricating a notch on the die of a surface emitting light emitting device by selective etching using the active layer, a quaternary material, as an etch stop is within the purview of an artisan of ordinary skill in the art having had the benefit of the present disclosure, such as deemed within the scope of the present invention.

I claim:

1. An optoelectronic apparatus comprising: a die having a mesa, the mesa having thereon a surface emitting optical device, the mesa having thereon a metallized p-type contact, a planar pad adjacent the mesa for Z-height registration with an optical bench, a first notch having been provided by a first etch, the first notch having thereon a metallized n-type contact that is coplanar with the p-type contact, a second notch having been provided by a second etch, the second notch having a side surface to abut the optical bench along an x-axis, the first notch extending to the second notch, and the die having side surfaces to abut the optical bench along a y-axis, and the second notch extending to the side surfaces.

2. An optoelectronic device as recited in claim 1, wherein the second notch is deeper than the first notch.

3. An optoelectronic device as recited in claim 1, wherein the surface emitting optical device has an optically active layer of quaternary material defining an alignment fiduciary edge facing the second slot.

4. An optoelectronic device as recited in claim 1, wherein the surface emitting optical device has an optically active layer of quaternary material defining an alignment fiduciary edge, and the second slot is reentrant beneath the active layer.

5. An optoelectronic device as recited in claim 1, wherein the surface emitting optical device has an optically active layer of quaternary material defining an alignment fiduciary edge, the second slot is reentrant beneath the active layer, and the surface emitting optical device has a layer of silicon dioxide extending to nearly the edge of the quaternary material but not extending to the edge of the quaternary material.

6. An optoelectronic device as recited in claim 1, wherein the surface emitting optical device has an optically active layer of quaternary material defining an alignment fiduciary edge, a p-type InP cladding layer over the quaternary material, a cap layer over the cladding layer, and a layer or silicon dioxide over the cap layer.

7. An optoelectronic device as recited in claim 1, wherein the surface emitting optical device has an optically active layer of quaternary material defining an alignment fiduciary edge, a p-type InP cladding layer over the quaternary material, a cap layer over the cladding layer, and a layer of silicon dioxide over the cap layer, and the layer of silicon dioxide extending to nearly the edge of the quaternary material but not extending to the edge of the quaternary material.

8. An optoelectronic device as recited in claim 1, wherein the surface emitting optical device has an optically active layer of quaternary material defining an alignment fiduciary edge, and the quaternary material is an etch-stop for the second notch having been produced by etching.

9. An optoelectronic device as recited in claim 1, wherein the surface emitting optical device has an optically active layer of quaternary material defining an alignment fiduciary edge, the quaternary material is an etch-stop for the second notch having been produced by etching, and a layer of silicon dioxide extending to nearly the edge of the quaternary material but not extending to the edge of the quaternary material.

10. An optoelectronic device as recited in claim 1, wherein the surface emitting optical device has an optically active layer of quaternary material defining an alignment fiduciary edge, a p-type InP cladding layer over the quaternary material, a cap layer over the cladding layer, and a layer of silicon dioxide over the cap layer, and the quaternary material is an etch-stop for the second notch having been produced by etching.

11. An optoelectronic device as recited in claim 1, wherein the surface emitting optical device has an optically active layer of quaternary material defining an alignment fiduciary edge, a p-type InP cladding layer over the quaternary material, a cap layer over the cladding layer, a layer or silicon dioxide over the cap layer, the layer of silicon dioxide extending to nearly the edge of the quaternary material but not extending to the edge of the quaternary material, and the quaternary material is an etch-stop for the second notch having been produced by etching.

* * * * *